(12) United States Patent
Hartman et al.

(10) Patent No.: US 9,915,972 B2
(45) Date of Patent: *Mar. 13, 2018

(54) SYSTEMS AND METHODS FOR COUPLING INFORMATION HANDLING RESOURCE DISPOSED IN INFORMATION HANDLING SYSTEM BEZEL

(71) Applicant: Dell Products L.P., Round Rock, TX (US)

(72) Inventors: Corey Dean Hartman, Hutto, TX (US); Salvador D. Jimenez, III, Cedar Park, TX (US); Syed S. Ahmed, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/277,176

(22) Filed: Sep. 27, 2016

(65) Prior Publication Data

US 2017/0017262 A1 Jan. 19, 2017

Related U.S. Application Data

(63) Continuation of application No. 14/601,469, filed on Jan. 21, 2015, now Pat. No. 9,477,260.

(51) Int. Cl.
*H05K 1/14* (2006.01)
*G06F 1/16* (2006.01)
*G06F 1/18* (2006.01)

(52) U.S. Cl.
CPC ............... *G06F 1/16* (2013.01); *G06F 1/181* (2013.01); *G06F 1/182* (2013.01)

(58) Field of Classification Search
CPC .......... G06F 1/1626; G06F 2200/1636; G06F 1/1692; H05K 5/0021
USPC ........ 361/736, 801–802, 728–730, 752, 796, 361/800, 759
See application file for complete search history.

(56) References Cited

U.S. PATENT DOCUMENTS

| | | |
|---|---|---|
| 5,440,449 A | 8/1995 | Scheer |
| 6,119,138 A | 9/2000 | Pinckney et al. |
| 6,650,532 B2 | 11/2003 | Shin |
| 7,420,800 B1 | 9/2008 | Knapp et al. |
| 7,490,520 B2 | 2/2009 | Murata |
| 9,477,260 B2 * | 10/2016 | Hartman ............... G06F 1/16 |
| 2003/0050091 A1 | 3/2003 | Tsai et al. |
| 2014/0080411 A1 | 3/2014 | Konanur et al. |

* cited by examiner

*Primary Examiner* — Hung S Bui
(74) *Attorney, Agent, or Firm* — Jackson Walker L.L.P.

(57) ABSTRACT

In accordance with embodiments of the present disclosure, a bezel configured to mechanically couple to a housing for housing components of an information handling system may include one or more mechanical features for mechanically coupling the bezel to the housing, an information handling resource mechanically coupled to a mechanical structure of the bezel, and a bezel connector having a plurality of pins communicatively coupled to the information handling resource. The bezel connector may be configured to communicatively couple the information handling resource to a second information handling resource of the information handling system housed within the housing when the bezel is mechanically coupled to the housing.

18 Claims, 7 Drawing Sheets

SYSTEMS AND METHODS FOR COUPLING INFORMATION HANDLING RESOURCE DISPOSED IN INFORMATION HANDLING SYSTEM BEZEL

TECHNICAL FIELD

The present disclosure relates in general to information handling systems, and more particularly to systems and methods for coupling an information handling resource, such as a communications module, to an information handling system, in which the information handling resource is disposed in an information handling system bezel.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In many typical server designs, a front portion of a server chassis often includes numerous hard disk drive bays for housing numerous modular hard disks. The information handling system industry is trending towards reducing the number of input/output (I/O) ports and control panel display surfaces on front panels of servers in order to allow more space for hard disk drive bays. In addition, recent advances allowing for wireless access to system management require a mechanical design of a server to provide space for a wireless interface and an associated antenna. However, for security reasons, many users may not desire a wireless interface to be present on a server.

SUMMARY

In accordance with the teachings of the present disclosure, the disadvantages and problems associated with provision of wireless communication access to an information handling system may be reduced or eliminated.

In accordance with embodiments of the present disclosure, a bezel configured to mechanically couple to a housing for housing components of an information handling system may include one or more mechanical features for mechanically coupling the bezel to the housing, an information handling resource mechanically coupled to a mechanical structure of the bezel, and a bezel connector having a plurality of pins communicatively coupled to the information handling resource. The bezel connector may be configured to communicatively couple the information handling resource to a second information handling resource of the information handling system housed within the housing when the bezel is mechanically coupled to the housing.

In accordance with these and other embodiments of the present disclosure, an information handling system comprising may include one or more information handling resources and a housing configured to house the one or more information handling resources. The housing may comprise one or more mechanical features for mechanically coupling a bezel to the housing and a housing connector mechanically mounted on the housing and communicatively coupled to at least one of the one or more information handling resources and configured to engage with a corresponding connector of the bezel in order to communicatively couple a second information handling resource mechanically coupled to the bezel to the at least one of the one or more information handling resources.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
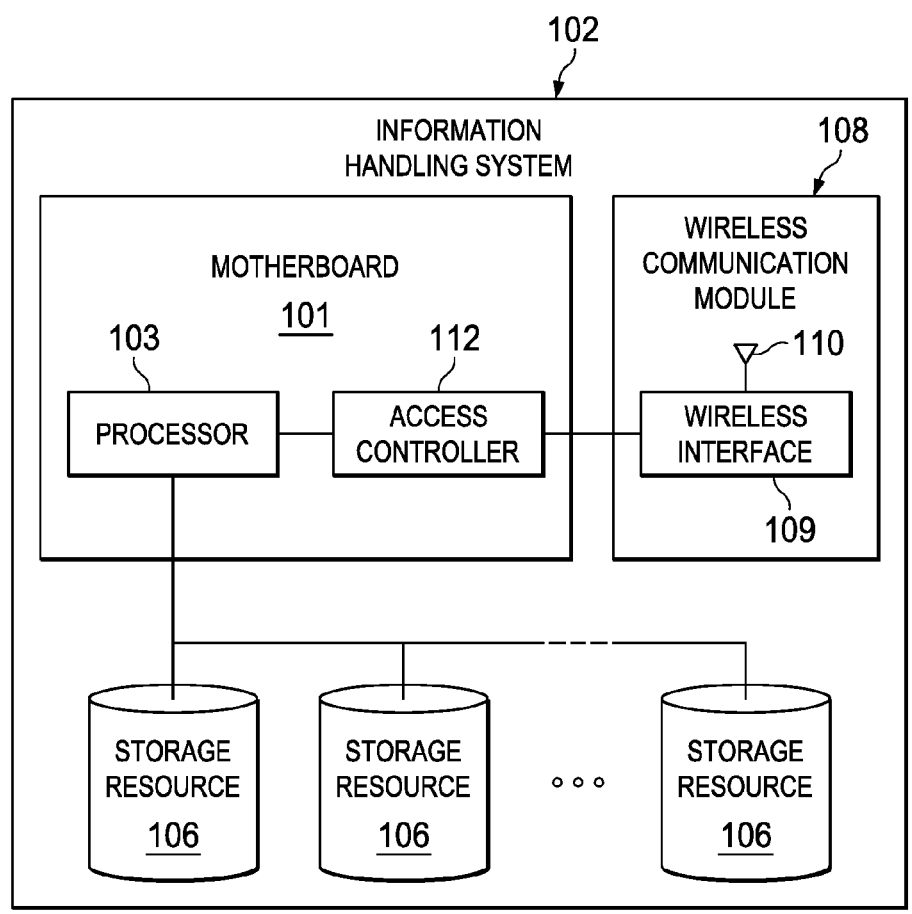
FIG. 1 illustrates a block diagram of selected components of an example information handling system, in accordance with embodiments of the present disclosure.

Preferred embodiments and their advantages are best understood by reference to FIGS. 1-6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs) etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

The terms "wireless transmissions" and "wireless communication" may be used to refer to all types of electromagnetic communications which do not require a wire, cable, or other types of conduits. Examples of wireless transmissions which may be used include, but are not limited to, short-range wireless communication technologies (e.g., proximity card, Radio-Frequency Identification (RFID), Near Field Communication (NFC), BLUETOOTH, ISO 14443, ISO 15693, or other suitable standard), personal area networks (PAN) (e.g., BLUETOOTH), local area networks (LAN), wide area networks (WAN), narrowband personal communications services (PCS), broadband PCS, circuit switched cellular, cellular digital packet data (CDPD), radio frequencies, such as the 800 MHz, 900 MHz, 1.9 GHz and 2.4 GHz bands, infra-red and laser.

For the purpose of this disclosure, "short-range wireless communications technology" refers to any suitable communications transport, protocol, and/or standard allowing two or more suitably-configured devices to communicate via wireless transmissions provided that such devices are within approximately one meter of each other. Examples of short-range communications technologies include, without limitation, BLUETOOTH Class 3, near field communication (NFC), radio frequency identification (RFID), proximity card, vicinity card, ISO 14443, and ISO 15693.

FIG. 1 illustrates a block diagram of an example of an information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer. In yet other embodiments, information handling system 102 may be a mobile device sized and shaped to be readily transported and carried on a person of a user of information handling system 102 (e.g., a smart phone, a tablet computing device, a handheld computing device, a personal digital assistant, etc.).

As shown in FIG. 1, information handling system 102 may include a motherboard 101, one or more storage resources 106, and a wireless communication module 108. Motherboard 101 may include a circuit board configured to provide structural support for one or more information handling resources of information handling system 102 and/or electrically couple one or more of such information handling resources to each other and/or to other electric or electronic components external to information handling system 102. As shown in FIG. 1, motherboard 101 may include a processor 103 and an access controller 112 communicatively coupled to processor 103.

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource 106, memory and/or another component of information handling system 102.

An access controller 112 may be communicatively coupled to processor 103 and may comprise any system, device, or apparatus configured to facilitate management and/or control of components of information handling system 102, information handling systems modularly coupled within, and/or one or more of its component information handling resources. Access controller 112 may be configured to issue commands and/or other signals to manage and/or control information handling resources of information handling system 102. Access controller 112 may comprise a microprocessor, microcontroller, DSP, ASIC, field programmable gate array ("FPGA"), EEPROM, or any combination thereof.

In addition or alternatively, access controller 112 may also provide a management console for user/administrator access to these functions. For example, access controller 112 may provide for communication with a user interface, permitting a user to interact with access controller 112 and configure control and management of components of information handling system 102 by access controller 112. As another example, access controller 112 may act as a proxy and establish communication between two information handling resources by either configuring them to directly couple to each other or transfer information by receiving information from one information handling resource, processing the information if needed, and then transferring the information to the other information handling resource. As a further example, access controller 112 may implement Web Services Management ("WS-MAN") or another suitable management protocol permitting a user to remotely access an access controller 112 to configure information handling system 102 and its various information handling resources. In such embodiments, access controller 112 may interface with a network interface separate from a traditional network interface of information handling system 102, thus allowing for "out-of-band" control of information handling system 102, such that communications to and from access controller 112 are communicated via a management channel physically isolated from an "in band" communication channel with the traditional network interface. Thus, for example, if a failure occurs in information handling system 102 that prevents an administrator from interfacing with information handling system 102 via a traditional network interface and/or user interface (e.g., operating system failure, power failure, etc.), the administrator may still be able to monitor and/or manage information handling system 102 (e.g., to diagnose problems that may have caused failure) via access controller 112. In the same or alternative embodiments, access controller 112 may allow an administrator to remotely manage one or more parameters associated with operation of information handling system 102 and its various information handling resources (e.g., power usage, processor allocation, memory allocation, security privileges, etc.). In certain embodiments, access controller 112 may include or may be an integral part of a chassis management controller (CMC), a baseboard management controller (BMC), Dell Remote Access Controller (DRAC) or an Integrated Dell Remote Access Controller (iDRAC).

Storage resources 106 may be communicatively coupled to processor 103, and may include any system, device, or apparatus configured to retain program instructions and/or data for a period of time (e.g., computer-readable media). Storage resources 112 may include hard disk drives, magnetic tape libraries, optical disk drives, magneto-optical disk drives, compact disk drives, compact disk arrays, disk array controllers, and/or any other system, apparatus or device operable to store media.

Wireless communication module 108 may be communicatively coupled to access controller 112 and may comprise any suitable system, apparatus, or device operable to serve as an interface between access controller 112 and another information handling system and/or a network. As shown in FIG. 1, wireless communication module 108 may comprise a wireless interface 109 communicatively coupled to access controller 112 and an antenna 110. Wireless interface 109 may enable information handling system 102 to communicate using any suitable transmission protocol and/or standard. In some embodiments, wireless interface 109 may be configured to communicate with another information handling system (e.g., a tablet, notebook, hand-held computer, mobile telephony device, etc.) via wireless transmissions, thus allowing a user of such other information handling system to perform management operations on access controller 112 via such other information handling system and wireless interface 109. In particular embodiments, wireless interface 109 may be configured to communicate with another information handling system via a short-range wireless communications technology. In these and other embodiments, wireless interface 109 may comprise a network interface card, or "NIC."

Antenna 110 may be communicatively coupled to wireless interface 109, and may comprise any system, device, or apparatus configured to convert electric power into radio waves, and vice versa.

In addition to motherboard 101, processor 103, storage resources 106, access controller 112, and wireless communication module 108, wireless interface 109, and antenna 110, information handling system 102 may include one or more other information handling resources.

Figure 2:
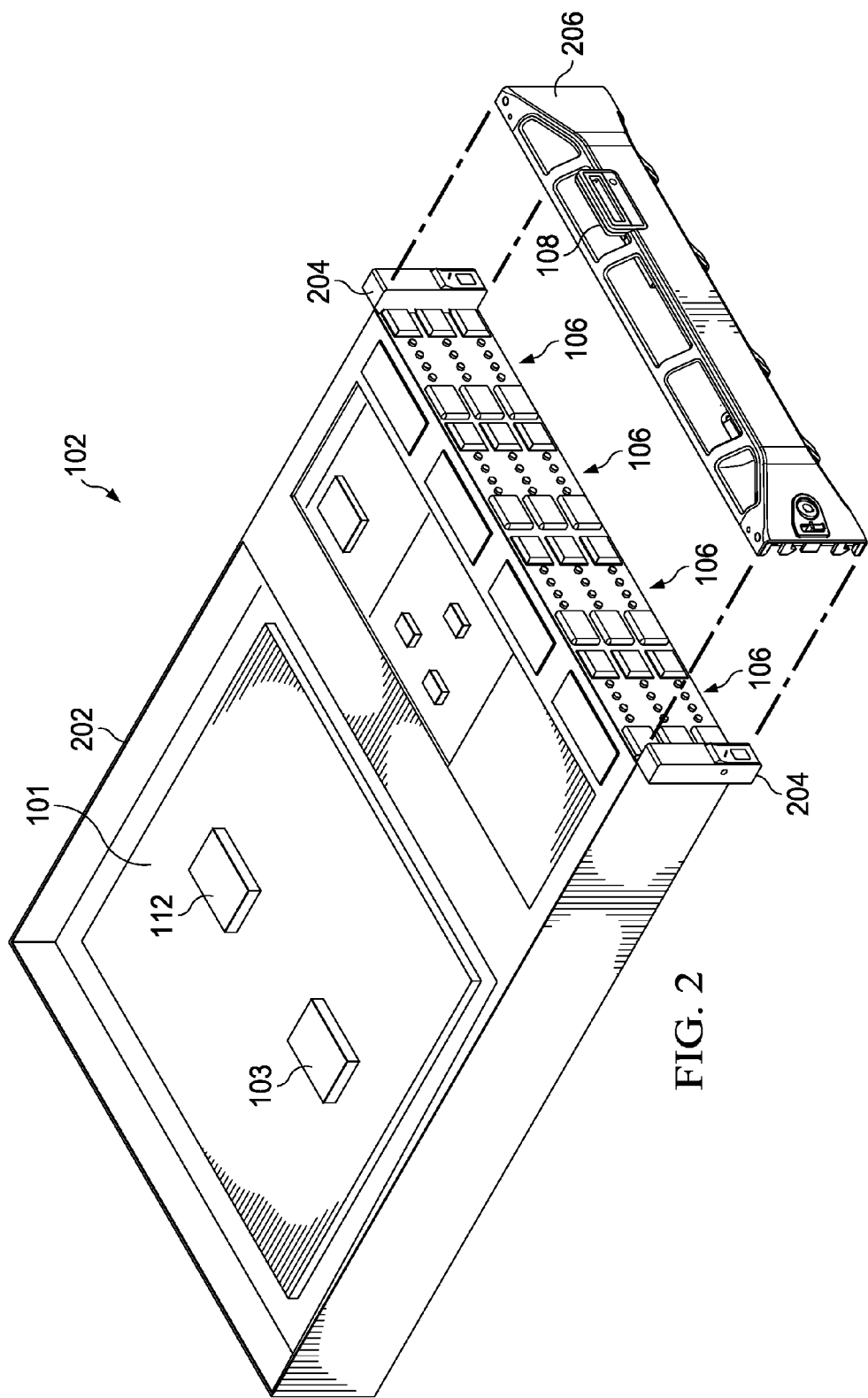
FIG. 2 illustrates a perspective view of selected components of the example information handling system of FIG. 1, in accordance with embodiments of the present disclosure.

FIG. 2 illustrates a perspective view of selected components of information handling system 102, in accordance with embodiments of the present disclosure. As shown in FIG. 2, information handling system 102 may comprise a housing 202 to house components of information handling system 102. In some embodiments, housing 202 may include a chassis or other enclosure including one or more mechanical features for supporting the various components of information handling system 102. In other embodiments, housing 202 may comprise a drawer or tray configured to be inserted into or removed from a server rack for housing multiple information handling systems.

As shown in FIG. 2, housing 202 may include ears 204 and a bezel 206. Bezel 206 may comprise any suitable mechanical structure for covering a front portion of information handling system 102. For example, bezel 206 may cover storage resources 106 for purposes of security and/or aesthetics. As described in greater detail below, bezel 206 may be readily detachable from the remainder of chassis 202 via ears 204. Bezel 206 may also include one or more mechanical features for housing wireless communication module 108.

An ear 204 may include one or more mechanical features for mechanically coupling bezel 206 to the remainder of housing 202 via corresponding mechanical features of bezel 206. In addition, as described in greater detail below, at least one ear 204 and bezel 206 may include corresponding electrically-conductive components permitting wireless communication module 108 to draw power, provide alerts, and/or communicatively couple to access controller 112 when bezel 206 is engaged with ears 204. In embodiments in which housing 202 comprises a drawer or sled, ears 204 may comprise mechanical components to allow a user to slide housing 202 into or out of a rack.

Figure 3A:
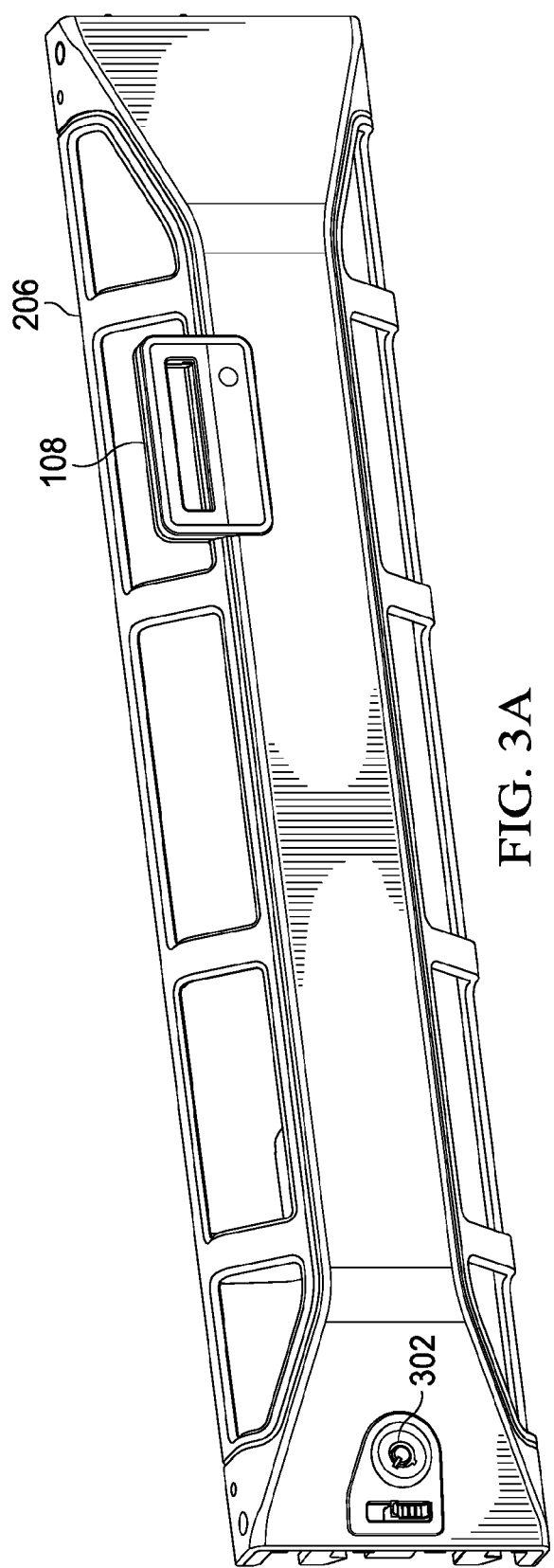
FIGS. 3A and 3B illustrate elevation views of opposite sides of a bezel, in accordance with embodiments of the present disclosure.
Figure 3B:
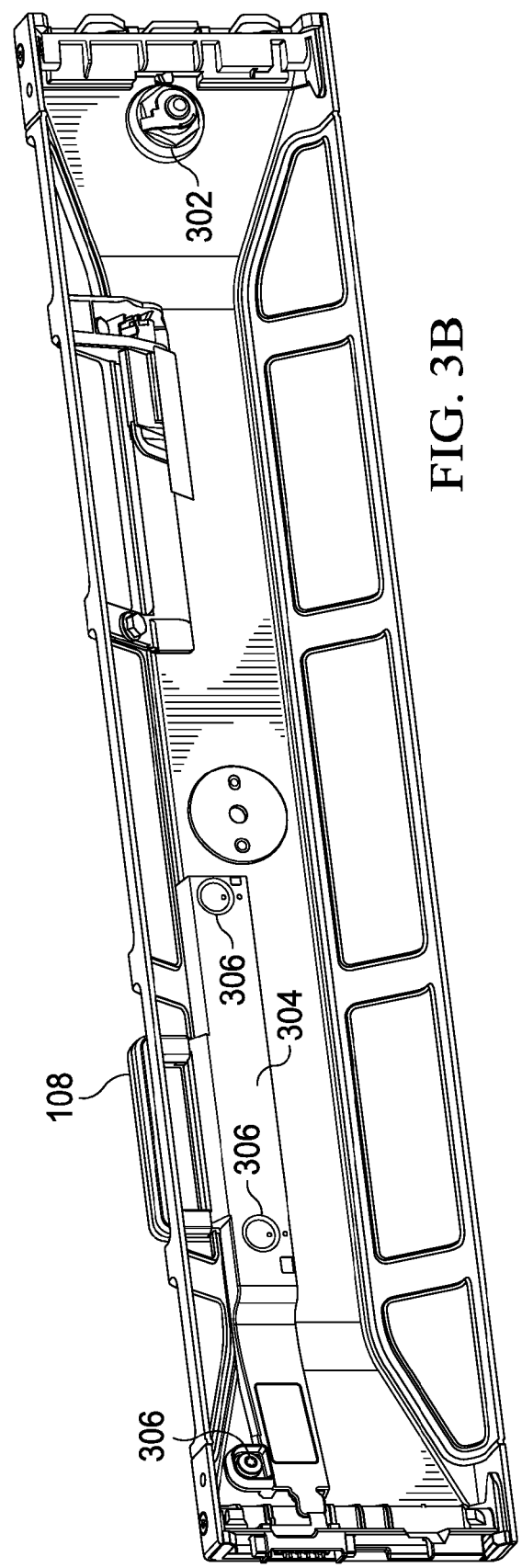

FIGS. 3A and 3B illustrate elevation views of opposite sides of bezel 206, in accordance with embodiments of the present disclosure. FIG. 3A depicts a front of bezel 206 (e.g., the side facing to the exterior of housing 202 when bezel 206 is engaged with ears 204) while FIG. 3B depicts a rear of bezel 206 (e.g., the side facing to the interior of housing 202 when bezel 206 is engaged with ears 204). As shown in FIGS. 3A and 3B, bezel 206 may comprise a lock 302 which may allow a user to mechanically manipulate lock 302 (e.g., with a key) to engage bezel 206 with one of ears 204 to secure bezel 206 in place. Further, as shown in FIG. 3B, wireless communication module 108 may include a cover 304 for covering components (e.g., wireless interface 109, antenna 110) of wireless communication module 108, and such cover 304 may be mechanically coupled to bezel 206 via one or more structural features 306 (e.g., guides, posts, screws, snaps, fasteners, etc.), thus supporting components of wireless communication module 108 within bezel 206. By including wireless communication module 108 within bezel 206 may allow for ease of access, as wireless communication module 108 may be accessed by an another information handling system external to information handling system 102 without removing bezel 206. Accordingly, this may provide access to wireless communication module 108 without the need of removing bezel 206, as might be the case if wireless communication module were internal to information handling system 102, and which might compromise security of information handling system 102.

In embodiments in which wireless communication capability is not desired, wireless communication module 108 may not be present in bezel 206, and such a bezel 206 without a wireless communication module 108 may be engaged with ears 204 (and, if desired, locked into place with lock 302 for security purposes).

Figure 4:
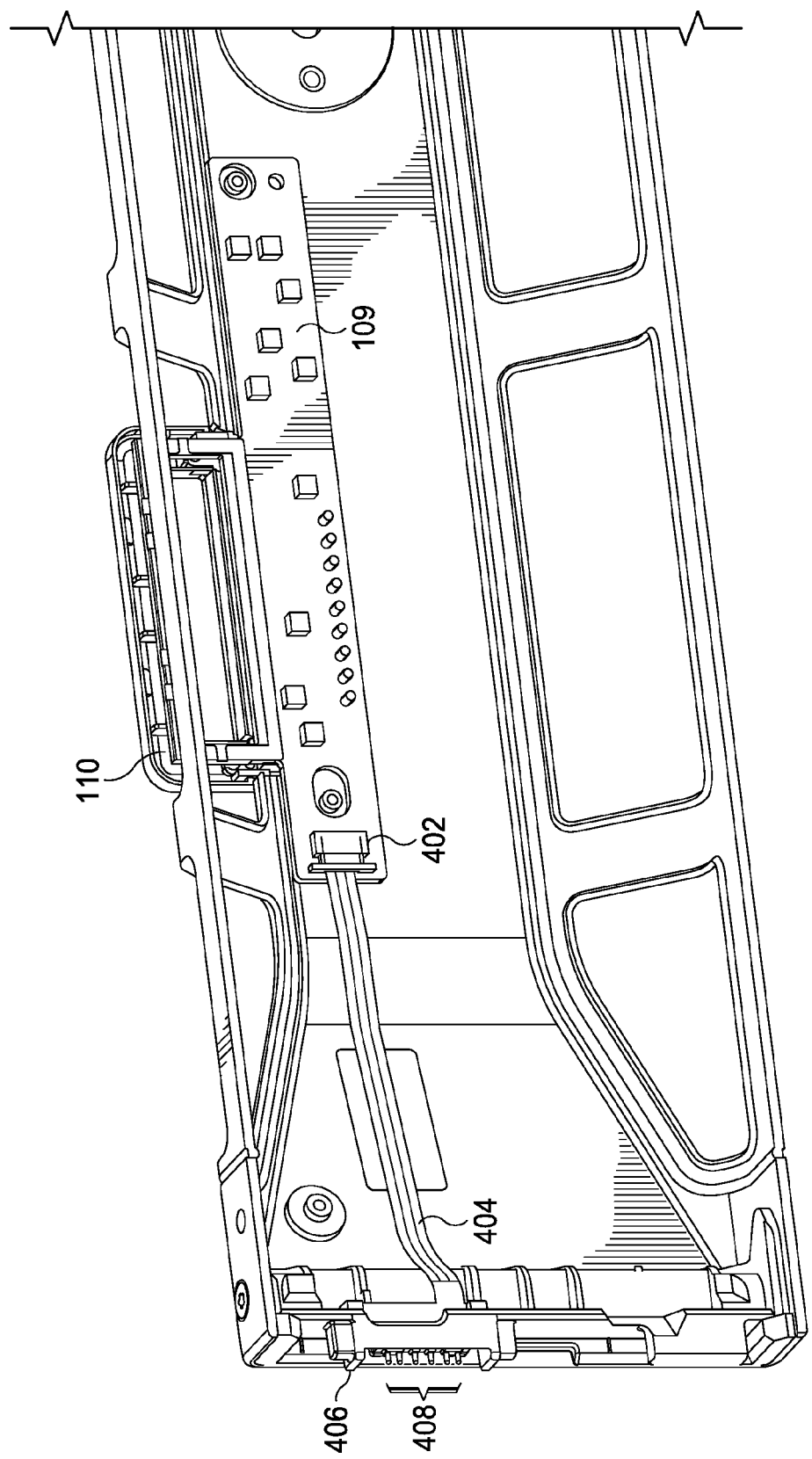
FIG. 4 illustrates detail of the view of FIG. 3B with a cover of a wireless communication module removed, in accordance with embodiments of the present disclosure.

FIG. 4 illustrates detail of the view of FIG. 3B with cover 304 of wireless communication module 108 removed for purposes of clarity and exposition, in accordance with embodiments of the present disclosure. As shown in FIG. 4, wireless interface 109 and antenna 110 may reside in bezel 206. Wireless interface 109 may comprise a connector 402 configured to electrically and mechanically couple a flexible circuit board 404 having a plurality of conductive traces to wireless interface 109. In some embodiments, a cable or harness of electrically-conductive wires may be used in lieu of flexible circuit board 404. The conductive traces of flexible circuit board 404 (or the wires of a cable or harness used in lieu thereof) may terminate into a connector 406 at an edge of bezel 206. In some embodiments, connector 406 may comprise a plurality of electrically conductive, spring-loaded pins 408 electrically coupled to conductive traces of flexible circuit board 404 (or the wires of a cable or harness used in lieu thereof).

Figure 5:
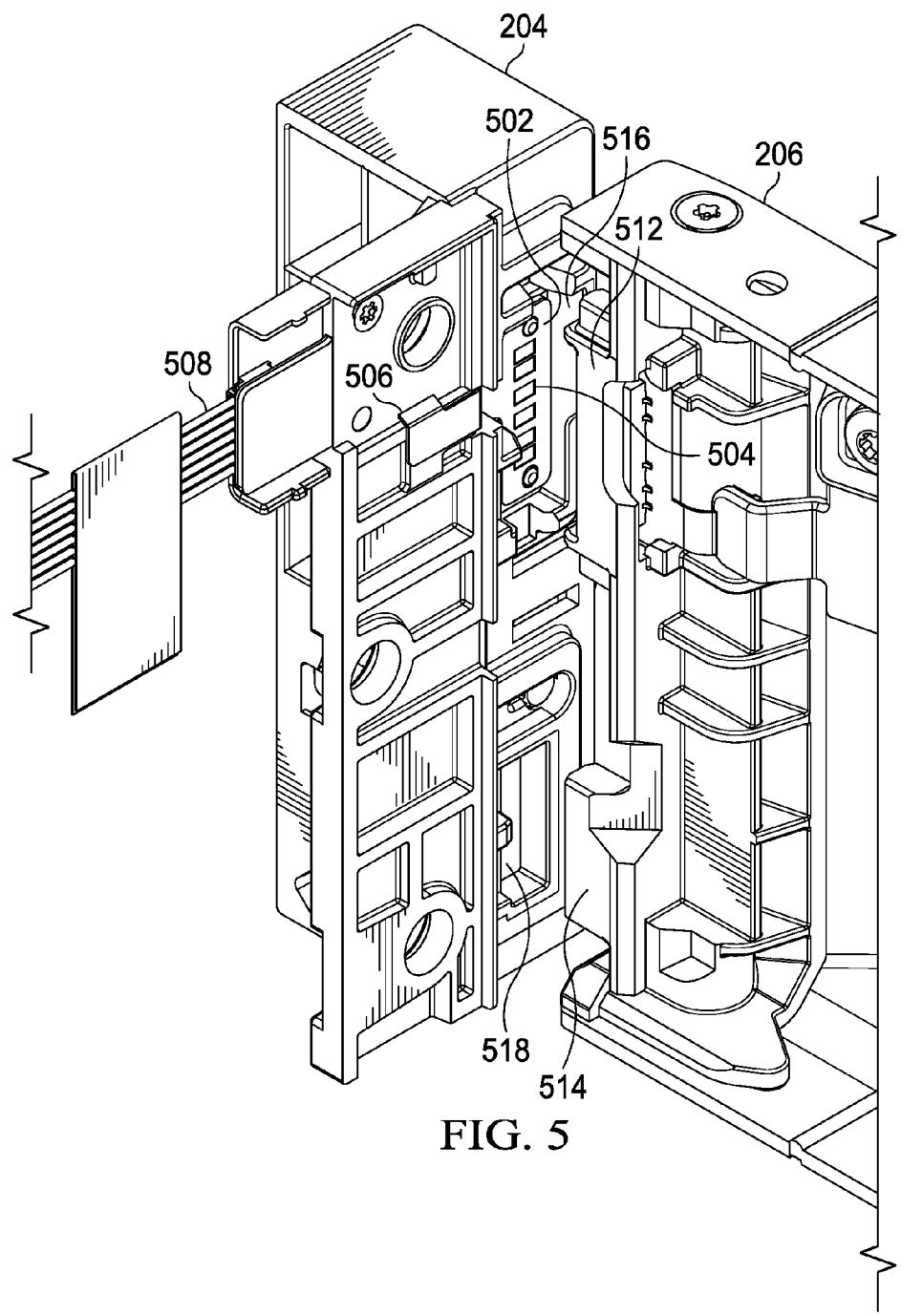
FIG. 5 illustrates detail of a bezel engaging with an ear, in accordance with embodiments of the present disclosure.

FIG. 5 illustrates detail of bezel 206 engaging with an ear 204, in accordance with embodiments of the present disclosure. As shown in FIG. 5, engagement of bezel 206 to the remainder of housing 202 may begin with a user "toe-ing in" mechanical features 512 and 514 of a first end of bezel 206 with corresponding mechanical features 516 and 518 of an ear 204. Such mechanical features may provide mechanical guiding, assisting the user in electrically coupling spring-loaded pins 408 of connector 406 to corresponding contacts 504 of a connector 502 integral to ear 204. Contacts 504 may be configured such that they prevent shorting of pins during insertion, removal, or other movement of bezel 206. For example, contacts 504 may be formed such that power and/or ground pins disconnect before any pin 408 can short to a contact 504 not intended for such pin 408.

Mechanical feature 512 may include or may support connector 408. Likewise, mechanical feature 516 may include or may support connector 502. However, in embodiments in which a bezel does not include wireless interface 109 or other information handling resource, mechanical feature 512 may be absent of a connector such as connector 406.

Contacts 504 of connector 502 may be electrically coupled to conductive traces of a flexible circuit board 506 (or the wires of a cable or harness used in lieu thereof) which in turn may terminate into a cable 508 configured to electrically couple to conductive traces of a flexible circuit board 506 (or the wires of a cable or harness used in lieu thereof) to a cable 508 (or wiring harness) of electrically conductive wires. After the first end of bezel 206 is engaged with a first ear 204, engagement of bezel 206 to the remainder of housing 202 may be completed by engagement of bezel 206 to a second ear 204.

Figure 6:
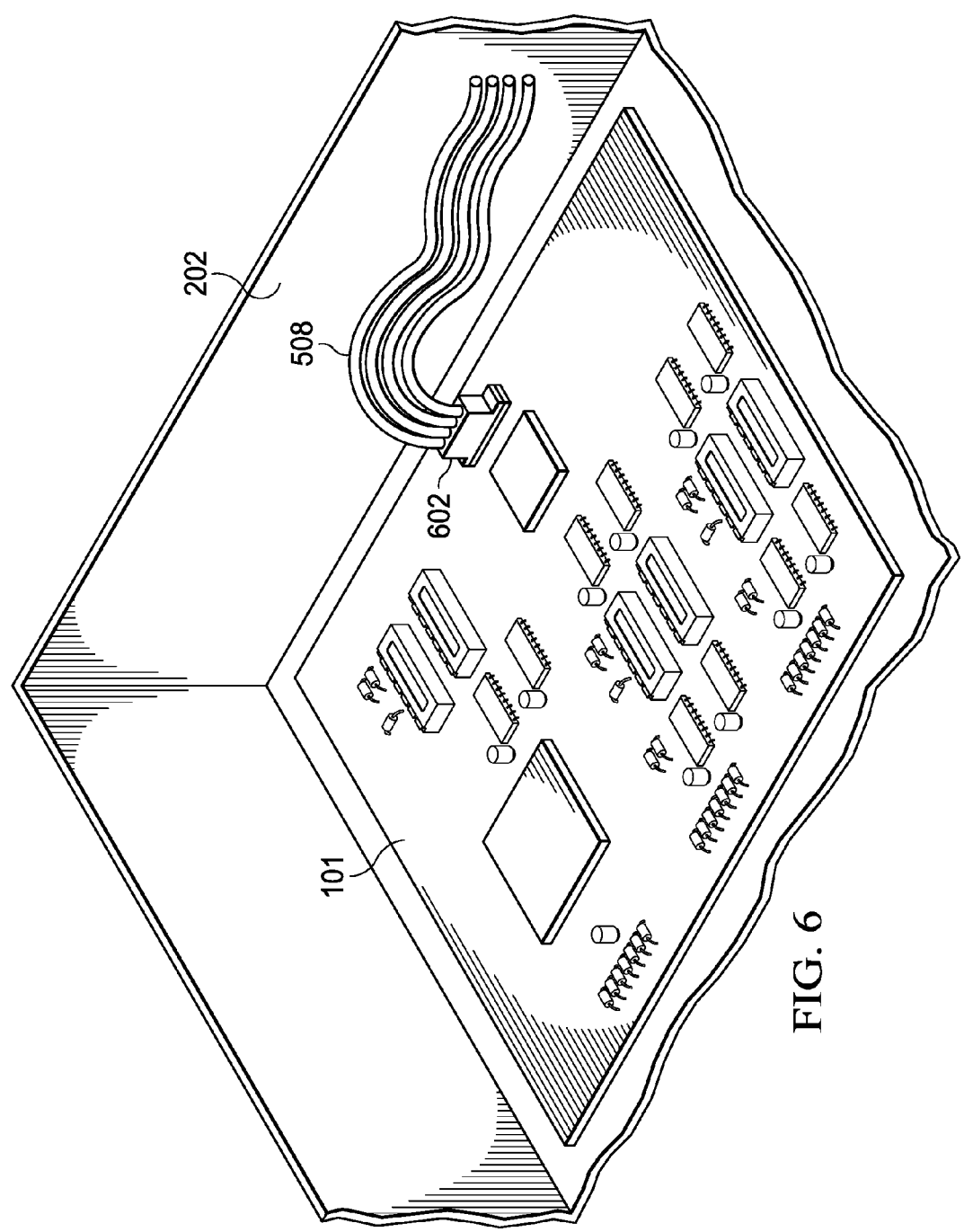
FIG. 6 illustrates detail of a cable coupling to a motherboard, in accordance with embodiments of the present disclosure.

FIG. 6 illustrates detail of cable 508 coupling to motherboard 101, in accordance with embodiments of the present disclosure. As shown in FIG. 6, wires of cable 508 may terminate into a connector 602 having electrically-conductive pins for coupling to corresponding wires of cable 508. Such electrically-conductive pins may in turn be electrically coupled to conductive traces of motherboard 101 which are coupled to access controller 112, thus providing for an electrical communication pathway between access controller 112 and wireless interface 109.

Although the foregoing discussion contemplates the communicative coupling of wireless communication module 108 housed in bezel 206 to an access controller 112, systems and methods similar or identical to those described herein may be utilized for communicatively coupling any suitable information handling resource mechanically mounted within a bezel to one or more other information handling resources within an information handling system.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A bezel configured to mechanically couple to a housing for housing components of an information handling system, the bezel comprising:
   one or more mechanical features for mechanically coupling the bezel to the housing;
   an information handling resource mechanically coupled to a mechanical structure of the bezel; and
   a bezel connector having a plurality of spring-loaded pins communicatively coupled to the information handling resource, the bezel connector configured to communicatively couple the information handling resource to a second information handling resource of the information handling system housed within the housing when the bezel is mechanically coupled to the housing, and each spring-loaded pin configured to electrically couple to a corresponding contact of a second connector mechanically coupled to the housing, wherein the contacts are each communicatively coupled to the second information handling resource.

2. The bezel of claim 1, further comprising a plurality of conductive elements coupled between the information handling resource and the bezel connector.

3. The bezel of claim 2, wherein the plurality of conductive elements comprise conductive traces of a flexible circuit board coupled between the information handling resource and the bezel connector.

4. The bezel of claim 2, wherein the plurality of conductive elements comprise wires of a cable coupled between the information handling resource and the bezel connector.

5. The bezel of claim 1, wherein the information handling resource comprises a wireless communication module.

6. The bezel of claim 5, wherein the wireless communication module comprises a wireless network interface and an antenna.

7. The bezel of claim 6, wherein the wireless network interface and the antenna are integral to a circuit board.

8. The bezel of claim 1, the one or more mechanical features configured to mechanically couple to an ear of the housing and the bezel connector configured to couple to a corresponding connector within the ear.

9. An information handling system comprising:
   one or more information handling resources, the one or more information handling resources comprising an access controller; and
   a housing configured to house the one or more information handling resources, the housing comprising:
      one or more mechanical features for mechanically coupling a bezel to the housing; and
      a housing connector mechanically mounted on the housing and communicatively coupled to at least one of the one or more information handling resources and configured to engage with a corresponding connector of the bezel in order to communicatively couple a second information handling resource mechanically coupled to the bezel to the at least one of the one or more information handling resources, wherein the second information handling resource comprises a wireless communication module.

10. The information handling system of claim 9, the one or more mechanical features formed in an ear of the housing, and the housing connector mechanically mounted to the ear.

11. The information handling system of claim 9, further comprising a plurality of conductive elements electrically coupling the housing connector to the at least one of the one or more information handling resources.

12. The information handling system of claim 11, wherein the plurality of conductive elements comprise conductive traces of a flexible circuit board coupled between the information handling resource and the bezel connector.

13. The information handling system of claim 11, wherein the plurality of conductive elements comprise wires of a cable coupled between the information handling resource and the bezel connector.

14. The information handling system of claim 9, wherein the housing connector comprises a plurality of contacts, each contact configured to electrically couple to a corresponding pin of a bezel connector electrically coupled to the second information handling resource.

15. A method comprising:
   mechanically coupling a bezel to a housing for housing components of an information handling system; and
   during mechanical coupling of the bezel to the housing, communicatively coupling a first information handling resource comprising an access controller and mechanically mounted within the bezel to a second information handling resource comprising a wireless communication module internal to the housing.

16. The method of claim 15, wherein mechanically coupling the bezel to the housing comprises mechanically coupling the bezel to an ear of the housing.

17. The method of claim 15, wherein the first information handling resource comprises a wireless communication module.

18. The method of claim 15, wherein the second information handling resource comprises an access controller.

* * * * *